United States Patent
Lvovsky (10) Patent No.: US 7,414,401 B1
(45) Date of Patent: Aug. 19, 2008

(54) SYSTEM AND METHOD FOR SHIELDED DYNAMIC SHIMMING IN AN MRI SCANNER

(75) Inventor: Yuri Lvovsky, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/690,953

(22) Filed: Mar. 26, 2007

(51) Int. Cl.
*G01V 3/00* (2006.01)
(52) U.S. Cl. ...................... 324/318; 324/309
(58) Field of Classification Search ......... 324/300–322; 600/407, 410, 419, 422
See application file for complete search history.

(56) References Cited

U.S. PATENT DOCUMENTS

| | | | | |
|---|---|---|---|---|
| 5,539,316 A | * | 7/1996 | Sukumar | 324/320 |
| 6,342,787 B1 | * | 1/2002 | Petropoulos et al. | 324/320 |
| 6,384,601 B1 | * | 5/2002 | Wiesler et al. | 324/309 |
| 6,479,998 B1 | * | 11/2002 | Yui et al. | 324/318 |
| 6,479,999 B1 | * | 11/2002 | DeMeester et al. | 324/318 |
| 6,538,443 B2 | * | 3/2003 | Morich et al. | 324/318 |
| 2007/0052419 A1 | * | 3/2007 | Overweg | 324/318 |

* cited by examiner

*Primary Examiner*—Brij B Shrivastav (57) ABSTRACT

A system for providing shielded dynamic shimming in a magnet assembly of a magnetic resonance imaging (MRI) scanner includes a main shim coil set located at a first radius in a gradient coil assembly of the magnet assembly. The system also includes a dynamic shim insert located at a second radius in the magnet assembly. The second radius is less than the first radius and is less than a radius of an RF coil in the magnet assembly. The main shim coil set may be operated as a shielding shim coil set for the dynamic shim insert.

22 Claims, 6 Drawing Sheets

SYSTEM AND METHOD FOR SHIELDED DYNAMIC SHIMMING IN AN MRI SCANNER

FIELD OF THE INVENTION

The present invention relates generally to a magnetic resonance imaging (MRI) system and in particular to a system and method for shielded dynamic shimming in a magnet assembly of an MRI scanner.

BACKGROUND OF THE INVENTION

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water or fat become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis and that varies linearly in amplitude with position along one of the x, y or z axes. The effect of a gradient coil is to create a small ramp on the magnetic field strength and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

MRI systems require a uniform main magnetic field, $B_0$, in the imaging volume, however, inhomogeneities in the magnetic field may be introduced by various factors such as manufacturing tolerances, environmental effects, design restrictions, imperfections in the magnet, ferromagnetic material near the installation site, and so forth. Inhomogeneities in the magnetic field, $B_0$, can adversely affect data acquisition and reconstruction of an MR image. For example, magnetic field inhomogeneities may distort position information in the scan volume and degrade the image quality. A process known as "shimming" may be used to compensate for or remove inhomogeneities from the magnetic field, $B_0$. An MRI magnet may be shimmed using shim or correction coils (active shimming) or passive shims such as pieces of ferromagnetic materials (passive shimming).

Active shimming uses dedicated coils in the magnet to generate a corrective magnetic field. Typically, a current is passed through the shim coils to create the corrective magnetic fields. The current through the shim coils may be adjusted or regulated to provide the appropriate corrective field. Shim coils may be resistive, superconducting or a combination of both. Superconducting shim coils are located inside the magnet and operate in a helium environment. Superconducting shim coils are used to compensate the inhomogeneities (harmonics) caused either by manufacturing tolerances or by the magnetic environment of the scanning room. Typically, the current in the superconducting shim coils is adjusted to a proper value(s) during installation or maintenance of the MRI scanner. Once the current is adjusted to the proper value(s), the current values are fixed and the superconducting coils operate in a persistent mode. To provide static compensation of patient-induced harmonics, which may vary from scan to scan, resistive shim coils (so-called high order shim coils) may be used. The resistive shim coils are often incorporated in the gradient assembly of an MRI scanner and typically include a second order set of shim coils for which the current may be adjusted between scans.

The development of more advanced MRI imaging techniques has created increasingly tight targets for homogeneity of the main magnetic field, $B_0$, during imaging of a patient, for example, when using protocols such as fMRI (functional MRI). In addition, the increasing size of the main magnetic field, $B_0$, in modern MRI scanners results in more stringent shimming requirements. Dynamic shimming may be used to address the more stringent shimming and homogeneity requirements. Dynamic shimming performs real-time compensation of field distortions (for example, the field distortions created by non-uniform distribution of magnetic susceptibility of a patient) that varies with motion such as during patient breathing. Resistive shim coils may be used to compensate for time varying harmonics by feeding the resistive shim coils with varying currents. Using the existing high order resistive shim coil set for dynamic shimming, however, may present a number of problems because the coils are unshielded. For example, if the unshielded resistive shim coils are pulsed, the resistive shim coils may create substantial eddy currents in the magnet structure that decay with varying time constants. The eddy currents may compromise image quality and may be difficult to compensate or correct. Coupling of the unshielded shim coils with the magnet structure, circuits and coils may create additional problems for dynamic shimming.

To address such problems, a shielded resistive shim coil set may be built for dynamic shimming, with its stray field minimized to reduce the potential interaction with the magnet structure and circuits. A shielded resistive shim coil set may be located in the gradient coil assembly. This, however, may significantly affect the cost, complexity and reliability of the gradient coil assembly. For example, an additional layer of shielding resistive shield coils has to be placed within a space inside the gradient coil assembly that is already occupied by other elements. The necessary radial separation between the main and shield shim coils to provide the required effectiveness (which increases with the radial distance between the main and shielding coil sets) may also be difficult to achieve within the limited radial space of the gradient coil assembly. Also, the effectiveness of the main shim coils is diminished during static compensation due to the opposite fields generated by the shielding shim coils. Since the main and shielding shim coils are connected in series, the same current is applied during all operations which can result in reduction of shim strength of the static compensation component. In addition, dynamic shimming capabilities may only be required at a limited number of sites with applications for which these advanced capabilities are critical. Incorporating a shielded high order resistive shim set in a standard gradient coil assembly would impose an unnecessary cost burden and reduction of static shimming capabilities on scanners not requiring the dynamic shimming.

There is a need for a system and method for shielded dynamic shimming that may be used with existing MRI scanners and that does not compromise the performance or cost of the static shimming components. It would be advantageous to provide a shielded dynamic shim system that utilizes a dynamic shim insert and a high order shim coil set in an MRI scanner.

BRIEF DESCRIPTION OF THE INVENTION

In accordance with an embodiment, a system for providing shielded dynamic shimming in a magnet assembly of a magnetic resonance imaging (MRI) scanner includes a main shim coil set located at a first radius in a gradient coil assembly of the magnet assembly and a dynamic shim insert located at a second radius in the magnet assembly, the second radius less than the first radius and less than a radius of an RF coil in the magnet assembly.

In accordance with another embodiment, a method for providing shielded dynamic shimming in a magnet assembly of a magnetic resonance imaging (MRI) scanner, the magnet assembly comprising a main shim coil set located at a first radius and a dynamic shim insert located at a second radius, includes applying a steady-state current component to the dynamic shim insert, applying a first dynamic current component to the dynamic shim insert, and applying a second dynamic current component to the main shim coil set, the second dynamic current component having the opposite polarity of the first dynamic current component.

In accordance with another embodiment, a method for providing shielded dynamic shimming in a magnet assembly of a magnetic resonance imaging (MRI) scanner, the magnet assembly comprising a main shim coil set located at a first radius and a dynamic shim insert located at a second radius, includes applying a steady-state current component to the main shim coil set, applying a first dynamic current component to the dynamic shim insert, and applying a second dynamic current component to the main shim coil set, the second dynamic current component having the opposite polarity of the first dynamic current component.

In accordance with yet another embodiment, a method for providing shielded dynamic shimming in a magnet assembly of a magnetic resonance imaging (MRI) scanner, the magnet assembly comprising a main shim coil set located at a first radius and a dynamic shim insert located at a second radius, includes applying a first steady-state current component to the main shim coil set, applying a second steady-state current component to the dynamic shim insert, applying-a first dynamic current component to the dynamic shim insert, and applying a second dynamic current component to the main shim coil set, the second dynamic current component having the opposite polarity of the first dynamic current component.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
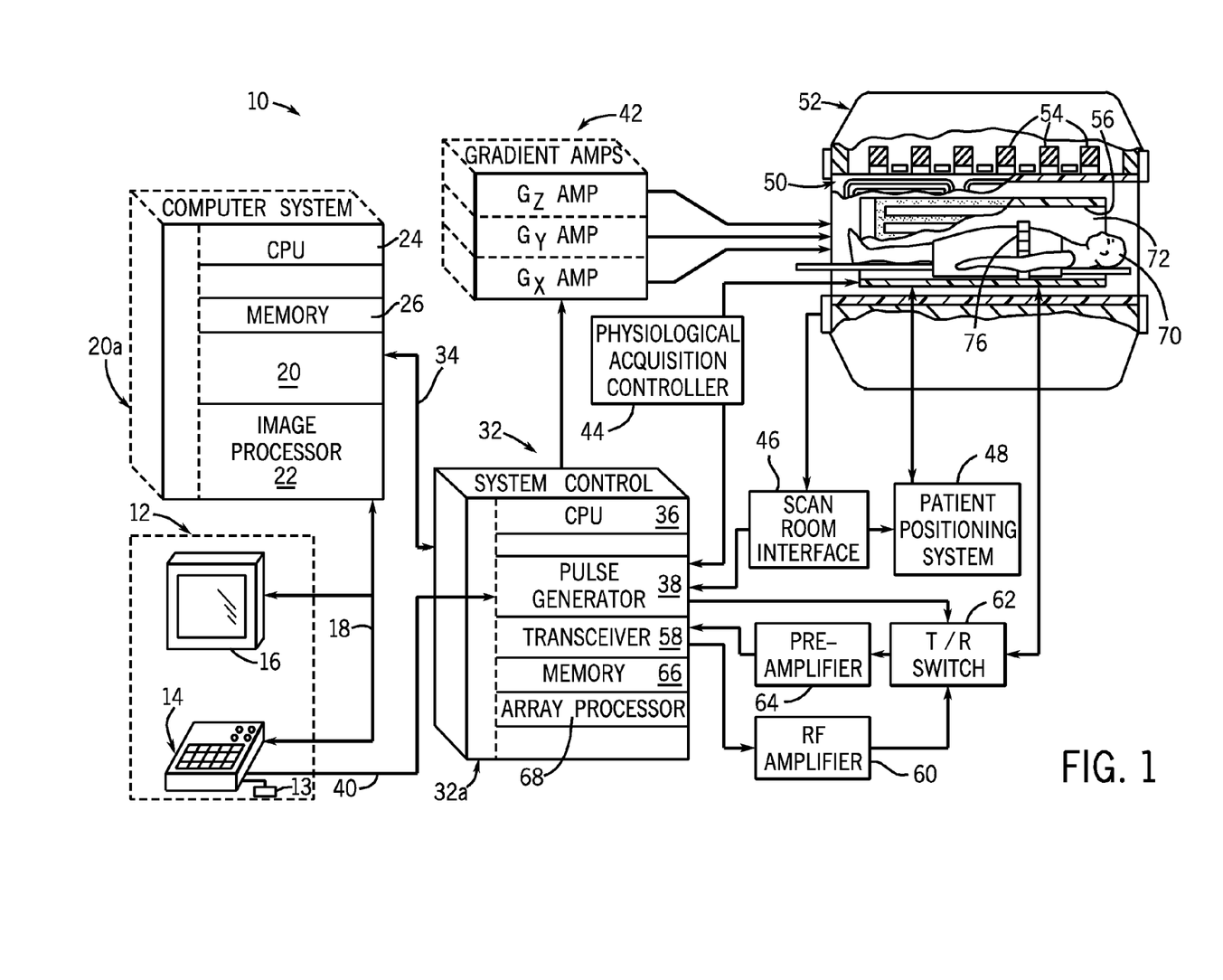
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 may be controlled from an operator console 12 that includes a keyboard or other input device 13, a control panel 14, and a display 16. The console 12 communicates through a link 18 with a computer system 20 and provides an interface for an operator to prescribe MRI scans, display the resultant images, perform image processing on the images and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of computer system 20 may include an image processor module 22, a CPU module 24 and a memory module 26 which may include a frame buffer for storing image data arrays. In an alternative embodiment, the image processor module 22 may be replaced by image processing functionality on the CPU module 24. The computer system 20 may also be connected to archival media devices, permanent or back-up memory storage or a network. Computer system 20 may also communicate with a separate system control computer 32 through a link 34. The input device 13 may include, for example, a mouse, joystick, keyboard, track ball, touch activated screen, light wand, voice control, or any similar or equivalent input device and may be used for interactive geometry prescription.

The system control computer 32 includes a set of modules in communication with each other electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., magnet assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests (e.g., radio frequency (RF) waveforms) describing the timing, strength and shape of the RF pulses and pulse sequences to be produced and the timing and length of the data acquisition window. The pulse generator module 38 also connects to a gradient amplifier system 42 and produces data called gradient waveforms which control the timing and shape of the gradient pulses that are to be used during the scan. The system control 32 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$, and $G_z$ amplifiers. Each gradient amplifier excites a corresponding physical gradient coil in a gradient coil assembly designated 50 to produce the magnetic field gradient pulses used for spatially encoding acquired signals. The gradient coil assembly 50 forms part of a magnet assembly 52 that includes a polarizing magnet 54 and may include a whole-body RF coil, 56, surface or parallel imaging coils 76 or both. The coils 56, 76 of the RF coil assembly may be configured for both transmitting and receiving, or for transmit-only or receive-only. A patient or imaging subject 70 may be positioned within a cylindrical patient imaging volume 72 of the magnet assembly 52. A transceiver module 58 in the system control computer 32 produces pulses that are amplified by an RF amplifier 60 and coupled to the RF coils 56, 76 by a transmit/receive switch 62. RF coil 56 may be replaced or augmented with surface and/or parallel transmit coils such as coil 76. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils, such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 may also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long term storage or it may be further processed by the image processor 22 and conveyed to the operator console 12 and presented on display 16.

Figure 2:
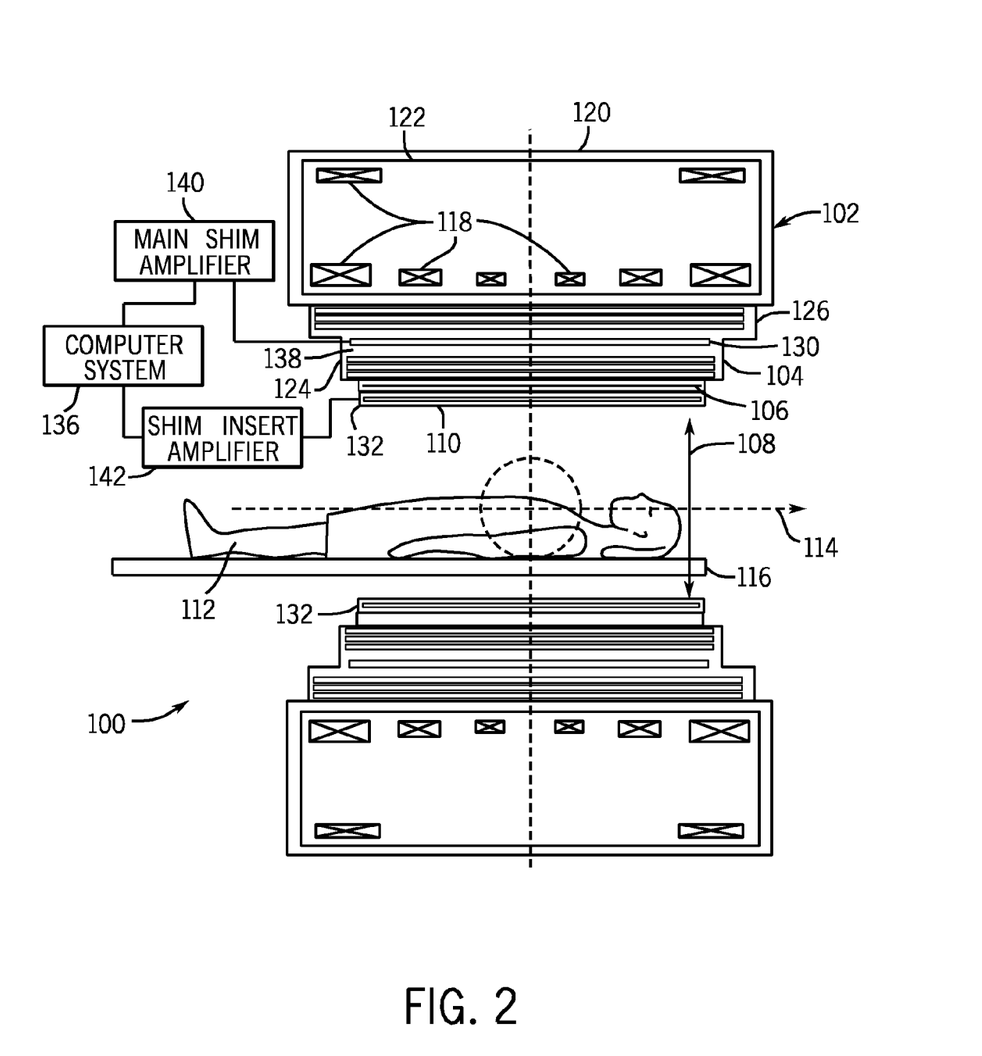
FIG. 2 is a schematic side elevation view of a magnet assembly including a dynamic shim insert in accordance with an embodiment.

A dynamic shim insert for dynamic shimming in a magnet assembly may be used with the above-described MR system or any similar or equivalent system for obtaining MR images. FIG. 2 is a schematic side elevation view of a magnet assembly including a dynamic shim insert in accordance with an embodiment. Magnet assembly 100 is cylindrical in shape and includes, among other elements, a superconducting magnet 102, a gradient coil assembly 104 and an RF coil 106. Various other elements such as covers, supports, suspension members, end caps, brackets, etc. are omitted from FIG. 2 for clarity. A cylindrical patient volume or bore 108 is surrounded by a patient bore tube 110. RF coil 106 is cylindrical and is disposed around an outer surface of the patient bore tube 110 and mounted inside the cylindrical gradient coil assembly 104. The gradient coil assembly 104 is disposed around the RF coil 106 in a spaced-apart coaxial relationship and the gradient coil assembly 104 circumferentially surrounds the RF coil 106. Gradient coil assembly 104 is mounted inside magnet 102 and is circumferentially surrounded by magnet 102.

A patient or imaging subject 112 may be inserted into the magnet assembly 100 along a center axis 114 (e.g., a z-axis) on a patient table or cradle 116. Center axis 114 is aligned along the tube axis of the magnet assembly 100 parallel to the direction of a main magnetic field, $B_0$, generated by the magnet 102. RF coil 106 may be used to apply a radio frequency magnetic field pulse (or a plurality of pulses) to a patient or subject 112 and may be used to receive MR information back from the subject 112. Gradient coil assembly 104 generates time dependent gradient magnetic pulses that are used to spatially encode points in the imaging volume.

Superconducting magnet 102 may include, for example, several radially aligned and longitudinally spaced apart superconductive coils 118, each capable of carrying a large, identical current. The superconductive coils 118 are designed to create a magnetic field, $B_0$, within the patient volume 108. The superconductive coils 118 are enclosed in a cryogenic environment within a cryogenic envelope 122. The cryogenic environment is designed to maintain the temperature of the superconducting coils 118 below the appropriate critical temperature so that the superconducting coils 118 are in a superconducting state with zero resistance. Cryogenic envelope 122 may include, for example, a helium vessel (not shown) and thermal or cold shields (not shown) for containing and cooling magnet windings in a known manner. Superconducting magnet 102 is enclosed by a magnet vessel 120, e.g., a cryostat vessel. Magnet vessel 120 is configured to maintain a vacuum and to prevent heat from being transferred to the cryogenic envelope 122.

Gradient coil assembly 104 may be a self-shielded gradient coil assembly. Gradient coil assembly 104 comprises a cylindrical inner gradient coil assembly or winding 124 and a cylindrical outer gradient coil assembly or winding 126 disposed in concentric arrangement with respect to a common axis 114. Inner gradient coil assembly 124 includes X-, Y- and Z-gradient coils and outer gradient coil assembly 126 includes the respective outer X-, Y- and Z-gradient coils. The coils of the gradient coil assembly 104 may be activated by passing an electric current through the coils to generate a gradient field in the patient volume 108 as required in MR imaging.

A standard high order main shim coil set 130 is located at a first radius inside the magnet assembly 100. In FIG. 2, the main shim coil set 130 is located inside the gradient coil assembly 104. For example, the main shim coil set 130 may be located in a volume or space 138 between the inner gradient coil assembly 124 and the outer gradient coil assembly 126. The main shim coil set 130 includes second order or higher unshielded resistive shim coils (not shown). Main shim coil set 130 is configured for use by itself to provide static compensation of magnetic field inhomogeneities, e.g., patient induced harmonics. In order to provide shielded-dynamic shimming for the magnet assembly 100, a dynamic shim insert 132 may be inserted and positioned at a second radius inside the magnet assembly 100. The second radius is smaller than the first radius at which the main shim coil set 130 is located. Preferably, as shown in FIG. 2, the dynamic shim insert 132 is positioned in the magnet assembly 100 at a radius smaller than the RF coil 106 radius. The dynamic shim insert 132 may be mounted to another component of the magnet assembly 100, for example, to the gradient coil assembly 104, the RF coil 106 or to the patient bore 110. In the embodiment shown in FIG. 2, the dynamic shim insert 132 is located between the RF coil 106 and the patient bore tube 110.

The dynamic shim insert 132 shown in FIG. 2 is a full-size dynamic shim insert and, accordingly, may be cylindrical and a similar length as the RF coil 106 cylinder. Dynamic shim insert 132 includes an unshielded resistive shim coil set. The main shim coil set 130 may be used as a shielding shim coil for the dynamic shim insert 132. Accordingly, main shim coil set 130 and dynamic shim insert 132 may be used as a shielded dynamic shim system. The necessary separation between the shielding shim coils (i.e., main shim coil set 130) and the dynamic shim insert 132 for shielded dynamic shimming is provided by the distance between the main shim coil set 130 in the gradient coil assembly 104 (at the first radius) and the dynamic shim insert 132 at the second smaller radius. Main shim coil set 130, acting as a shielding shim coil set, together with the dynamic shim insert 132 may be used to provide the appropriate dynamic shimming to maintain the homogeneity of the magnetic field generated by the magnet 102.

Main shim coil set 130 may be powered by an amplifier 140 and the dynamic shim insert 132 may be powered by a separate amplifier namely amplifier 142. The waveforms of each amplifier 140, 142 may be controlled and correlated by a computer system 136 (e.g., computer 20 or system control computer 32 shown in FIG. 1). Alternatively, high order main shim coil set 130 and dynamic shim insert 132 may be connected in reverse series and both connected to a single amplifier. In this embodiment, operation of the single amplifier may be controlled by the computer 136. The dynamic shim insert 132 may have a separate power supply (not shown) that is operated by the same computer 136 as the power supply for the main shim coil set 130. Alternatively, the dynamic shim insert 132 and the main shim coil set 130 may be powered by the same power supply (not shown) with the main shim coil set 130 connected in series with reverse polarity.

Computer 136 and amplifiers 140, 142 are configured to control the current supplied to main shim coil set 130 and dynamic shim insert 132. In particular, during a scan operation, the resistive shim coils of main shim coil set 130 and the resistive shim coils of dynamic shim insert 132 are energized to provide both a steady-state shimming component and a dynamic shimming component to provide real-time compensation of magnetic field distortions. During operation, main shim coil set 130 may be operated with currents in reverse to provide shielding to the dynamic shim insert 132.

Figure 3:
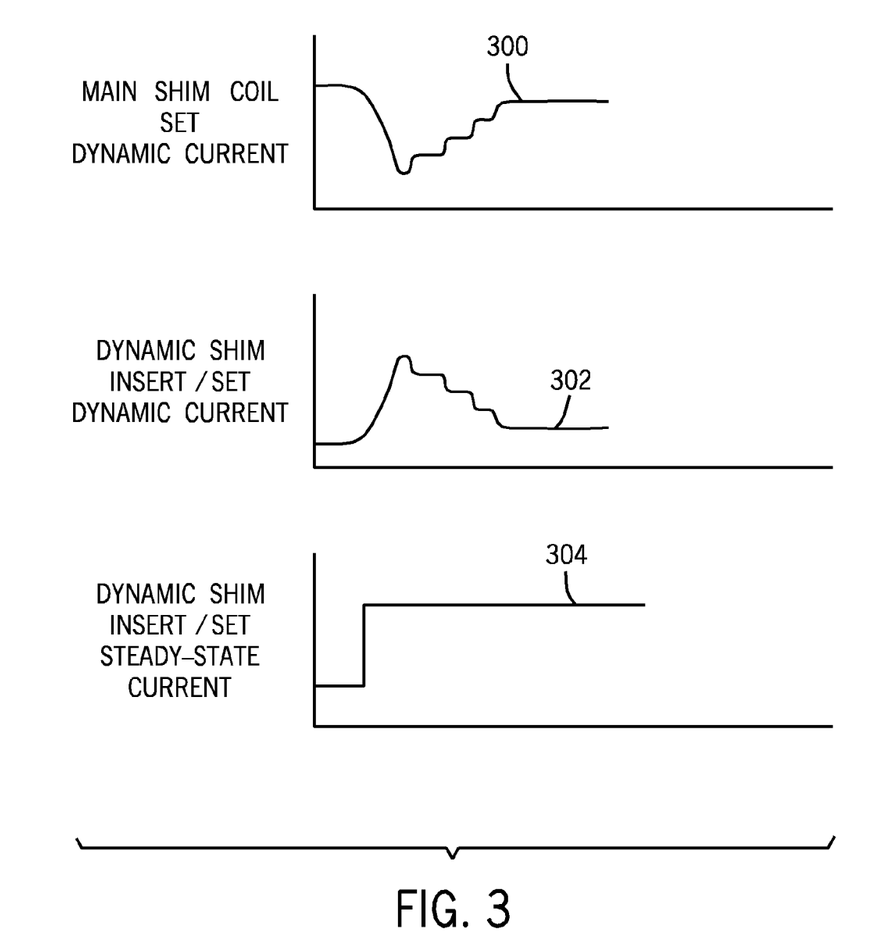
FIG. 3 shows exemplary steady-state and dynamic current components that may be applied to the main shim coil set and the dynamic shim insert in accordance with an embodiment.

In one embodiment, a steady-state shimming component may be generated by the dynamic shim insert 132 only and a dynamic shimming component may be generated and shielded by both the dynamic shim insert 132 and the main shim coil set 130. FIG. 3 shows exemplary steady-state and dynamic current components that may be applied to the main shim coil set and the dynamic shim insert. In order to generate the shielded dynamic shimming components, a dynamic current component 302 is applied (e.g., by amplifier 142 shown in FIG. 2) to the dynamic shim insert 132 (shown in FIG. 2) and a dynamic current component 300 (of opposite polarity) is applied (e.g., by amplifier 140 shown in FIG. 2) to the main shim coil set (shown in FIG. 2). In order to generate the steady-state shimming component, a steady-state current component 304 is applied (e.g., by amplifier 142) to the dynamic shim insert 132. In this configuration, a higher static shimming capacity may be generated per unit steady-state current because the dynamic shim insert 132 (which is used to generate the steady-state shimming component) is located closer to the shimmed volume.

Figure 4:
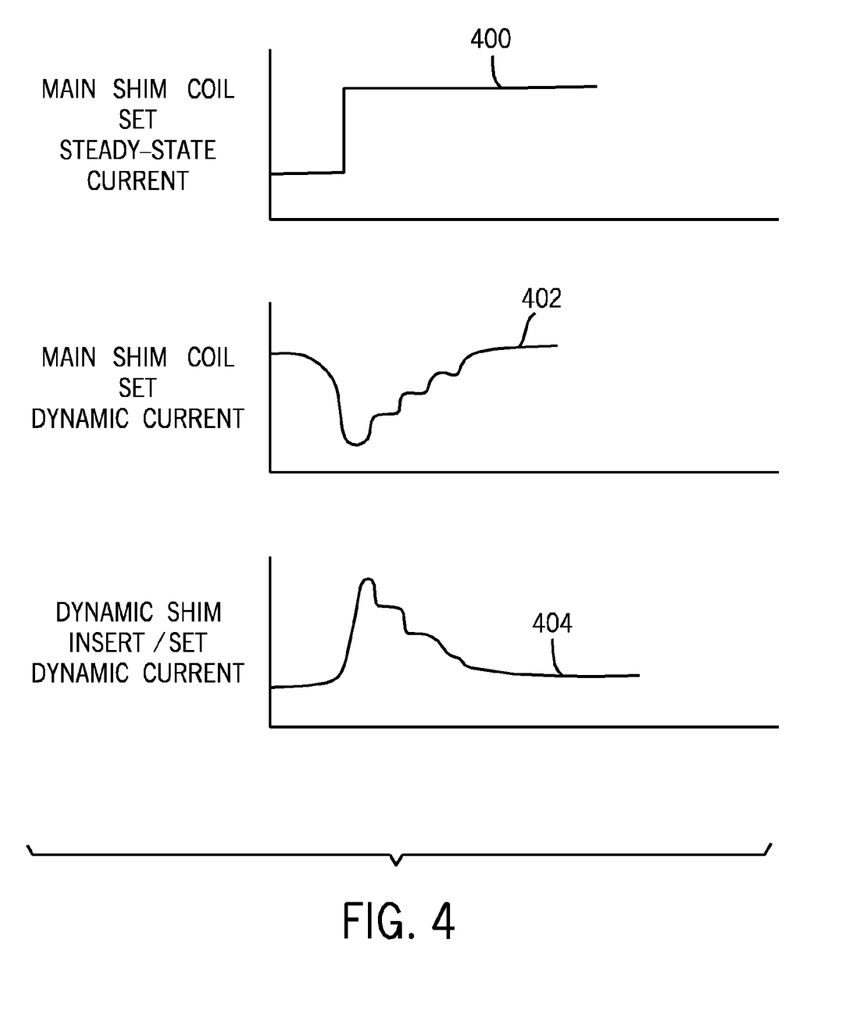
FIG. 4 shows exemplary steady-state and dynamic current components that may be applied to the main shim coil set and the dynamic shim insert in accordance with an alternative embodiment.

In another embodiment, the steady-state shimming component may be supplied by the main shim coil set 130 only and a shielded dynamic shimming component may be provided by both the main coil shim set 130 and the dynamic shim insert 132. FIG. 4 shows exemplary steady-state and dynamic current components that may be applied to the main shim coil set and the dynamic shim insert. A steady-state current component 400 is applied to the main shim coil set to generate the steady-state shimming component. A dynamic current component 404 is applied to the dynamic shim insert and a dynamic current component 402 (of opposite polarity) is applied to the main shim coil set to generate a shielded dynamic shimming component. In this embodiment, the dynamic shim insert would not need to be sized for steady-state currents by only for the dynamic current component. The dynamic shim insert, therefore, may require less ampere-turns and occupy less radial space in the magnet assembly.

Figure 5:
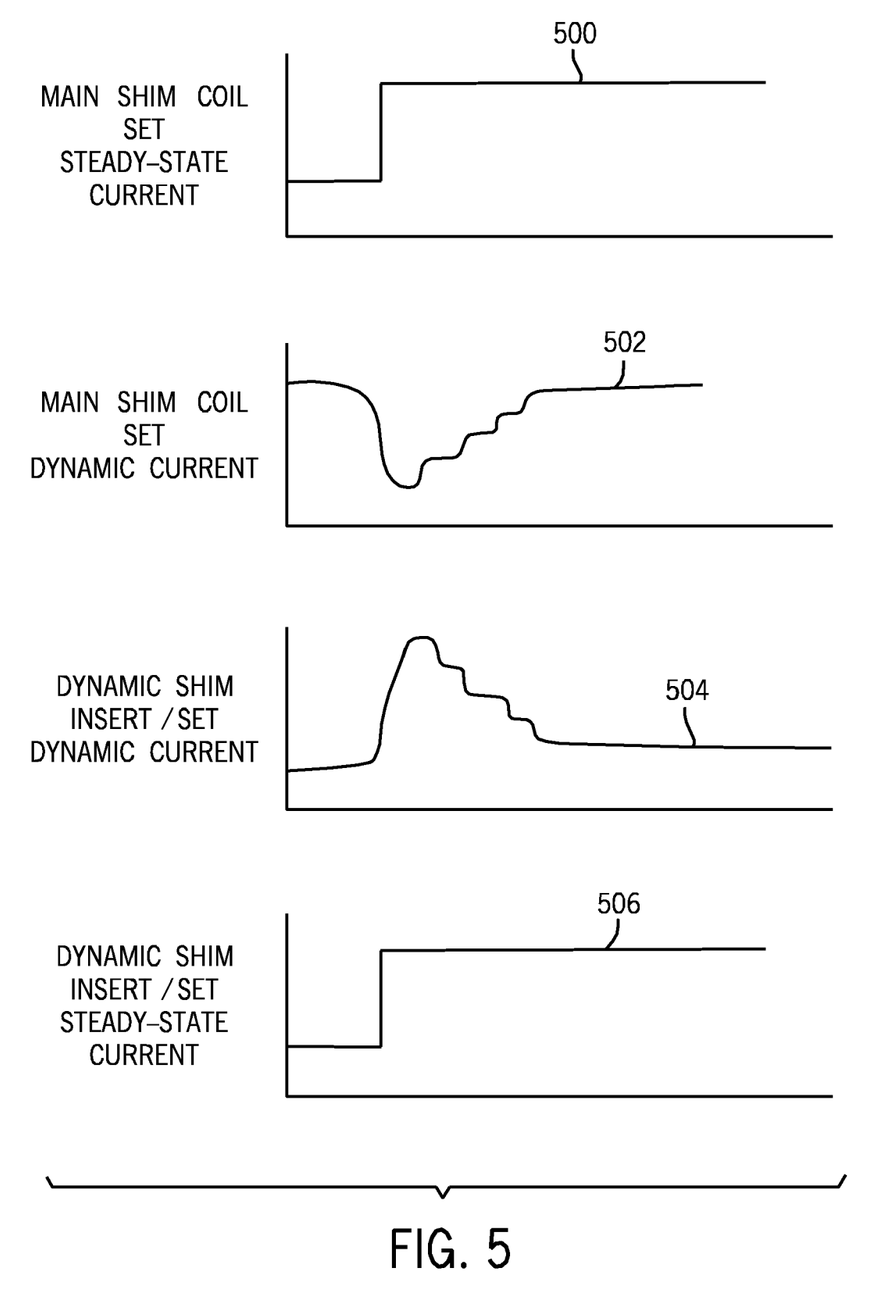
FIG. 5 shows exemplary steady-state and dynamic current components that may be applied to the main shim coil set and the dynamic shim insert in accordance with an alternative embodiment.

In yet another embodiment, a steady-state shimming component may be generated by both the main shim coil set and the dynamic shim insert with the same polarity (i.e., direction) so that the strengths of each steady-state shimming component are added. In addition, the shielded dynamic shimming component is generated by both the main shim coil set and the dynamic shim insert. FIG. 5 shows exemplary steady-state and dynamic current components that may be applied to the main shim coil set and the dynamic shim insert. A steady-state current component 500 is applied to the main shim coil set and a steady-state current component 506 is applied to the dynamic shim insert to generate steady state shimming components. A dynamic current component 504 is applied to the dynamic shim insert and a dynamic current component 502 (of opposite polarity) is applied to the main shim coil set to generate a shielded dynamic shimming component. As mentioned above, in an alternative embodiment, the main shim coils set and the dynamic shim insert may be connected in series to a single amplifier. Accordingly, in this embodiment, a steady state current component may be applied to both the main shim coil set and the dynamic shim insert with opposite polarity using the single amplifier and resulting in a shielded steady-state shimming component.

Figure 6:
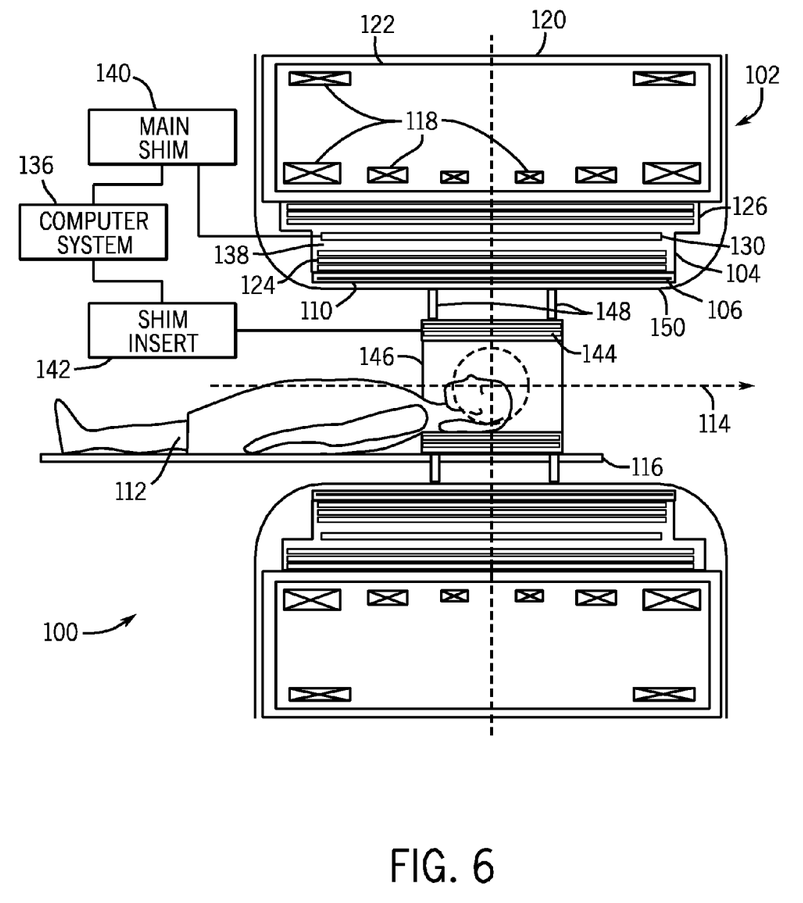
FIG. 6 is a schematic side elevation view of a magnet assembly including a dynamic shim insert in accordance with an alternative embodiment.

One common MRI application that may require dynamic shimming is brain imaging. FIG. 6 is a schematic side elevation view of a magnet assembly including a dynamic shim insert in accordance with an alternative embodiment. Magnet assembly 100 is configured for brain imaging and comprises, among other elements, a head RF coil 146 insert in addition to the whole-body RF coil 106. Head coil 146 may be centered around the magnetic isocenter by, for example, positioning the head coil 146 on a patient table 116 or, alternatively, by using mounts 148 attached to a magnet enclosure 150. A standard high order main shim coil set 130 is located at a first radius inside the magnet assembly 100, for example, inside the gradient coil assembly 104. The main shim coil set 130 includes second order or higher unshielded resistive shim coils (not shown). As mentioned above with respect to FIG. 2, main shim coil set 130 is configured for use by itself to provide static compensation of magnetic field inhomogeneities, e.g., patient-induced harmonics.

In order to provide shielded dynamic shimming for the magnet assembly 100, a dynamic shim set or insert 144 may be incorporated in the structure (e.g., either inside or outside) of the head coil 146. Accordingly, dynamic shim set 144 may be a similar shape and length as head coil 146. Other elements, such as local gradients (not shown), may also be located in the head coil 146. The dynamic shim set 144 is positioned at a second radius that is smaller than the first radius at which the main shim coil set 130 is located. Preferably, as shown in FIG. 6, the dynamic shim set 144 is positioned at a radius smaller than the RF coil 106 radius. While FIG. 6 illustrates a head coil 146 insert, it should be understood that a dynamic shim set may be incorporated in the structure of other specialty coils that are positioned at a smaller radius in the magnet assembly than the main shim coil set 130. Dynamic shim insert 144 includes unshielded resistive shim coils. The main shim coil set 130 may be used as a shielding shim coil for the dynamic shim set 144. Accordingly, main shim coil set 130 and dynamic shim set 144 may be used as a shielded dynamic shim system. The distance between the high order main shim coil set 130 (acting as shielding shim coils) and the dynamic shim set 144 provides the necessary separation for dynamic shimming. Dynamic shim set 144 may be more effective and require less current because of the amount of separation between the dynamic shim set 144 in the head coil 146 and the main shim coil set 130 in the gradient assembly 104 and the proximity of the dynamic shim set 144 to the shimmed volume.

Main shim coil set 130 may be powered by an amplifier 140 and dynamic shim set 144 may be powered by a separate amplifier, namely, amplifier 142. The waveforms generated by each amplifier 140, 142 may be controlled or correlated by a computer system 136 (e.g., computer 20 or system control computer 32 shown in FIG. 1). Alternatively, high order main shim coil set 130 and dynamic shim set 144 may be connected in reverse series and both connected to a single amplifier. In this embodiment, the operation of the single amplifier may be controlled by the computer 136. The dynamic shim set 144 may have a separate power supply (not shown) that is operated by the same computer 136 as the power supply (not shown) for the main shim coil set 130. Alternatively, the dynamic shim set 144 and the main shim coil set 130 may be powered by the same power supply (not shown) with the main shim coil set 130 connected in series with reverse polarity.

Computer 136 and amplifiers 140, 142 are configured to control the current supplied to shim coil set 130 and dynamic shim set 144. During a scan operation, the resistive shim coils of main shim coil set 130 and dynamic shim set 144 are energized to provide both a steady-state shimming component and a dynamic shimming component to provide real-time compensation of magnetic field distortions. As discussed above with respect to FIGS. 2-5, various methods may be used to provide shielded dynamic shimming using the main shim coil set 130 (acting as a shielding shim coil set) and dynamic shim set 144. In one embodiment, a steady-state shimming component may be generated by the dynamic shim set 144 only and a shielded dynamic shimming component may be generated using both the dynamic shim set 144 and the main shim coil set 130. In another embodiment, the steady-state shimming component may be supplied by the main shim coil set 130 only and a shielded dynamic shimming component may be provided using both the main coil shim set 130 and the dynamic shim set 132. In yet another embodiment, a steady-state shimming component may be generated by both the main shim coil set 130 and the dynamic shim set 144 with the same polarity and the shielded dynamic shimming component is generated by both the main shim coil set 130 and the dynamic shim set 144. As mentioned above, in an alternative embodiment, the main shim coils set and the dynamic shim set may be connected in series to a single amplifier. Accordingly, using a single amplifier, a steady state shimming component may be generated by both the main shim coil set and the dynamic shim set with opposite polarity resulting in a shielded steady-state shimming component.

This written description uses examples to disclose embodiments of the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. A system for providing shielded dynamic shimming in a magnet assembly of a magnetic resonance imaging (MRI) scanner, the system comprising:
   a main shim coil set located at a first radius in a gradient coil assembly of the magnet assembly; and
   a dynamic shim insert located at a second radius in the magnet assembly, the second radius less than the first radius and less than a radius of an RF coil in the magnet assembly.

2. A system according to claim 1, wherein the main shim coil set comprises at least one unshielded resistive shim coil.

3. A system according to claim 1, wherein the dynamic shim insert comprises at least one unshielded resistive shim coil.

4. A system according to claim 1, wherein the dynamic shim insert is incorporated in a head coil.

5. A system according to claim 1, further comprising a first amplifier coupled to the main shim coil set.

6. A system according to claim 5, further comprising a second amplifier coupled to the dynamic shim insert.

7. A system according to claim 6, further comprising a computer system coupled to the first amplifier and the second amplifier.

8. A method for providing shielded dynamic shimming in a magnet assembly of a magnetic resonance imaging (MRI) scanner, the magnet assembly comprising a main shim coil set located at a first radius and a dynamic shim insert located at a second radius, the method comprising:
   applying a steady-state current component to the dynamic shim insert;
   applying a first dynamic current component to the dynamic shim insert; and
   applying a second dynamic current component to the main shim coil set, the second dynamic current component having the opposite polarity of the first dynamic current component.

9. A method according to claim 8, wherein applying a steady-state current component comprises energizing at least one shim coil of the dynamic shim insert.

10. A method according to claim 8, wherein applying a first dynamic current component comprises energizing at least one shim coil of the dynamic shim insert.

11. A method according to claim 8, wherein applying a second dynamic current component comprises energizing at least one shim coil of the main shim coil set.

12. A method for providing shielded dynamic shimming in a magnet assembly of a magnetic resonance imaging (MRI) scanner, the magnet assembly comprising a main shim coil set located at a first radius and a dynamic shim insert located at a second radius, the method comprising:

applying a steady-state current component to the main shim coil set;

applying a first dynamic current component to the dynamic shim insert; and applying a second dynamic current component to the main shim coil set, the second dynamic current component having the opposite polarity of the first dynamic current component.

13. A method according to claim 12, wherein applying a steady-state current component comprises energizing at least one shim coil of the main shim coil set.

14. A method according to claim 12, wherein applying a first dynamic current component comprises energizing at least one shim coil of the dynamic shim insert.

15. A method according to claim 12, wherein applying a second dynamic current component comprises energizing at least one shim coil of the main shim coil set.

16. A method for providing shielded dynamic shimming in a magnet assembly of a magnetic resonance imaging (MRI) scanner, the magnet assembly comprising a main shim coil set located at a first radius and a dynamic shim insert located at a second radius, the method comprising:

applying a first steady-state current component to the main shim coil set;

applying a second steady-state current component to the dynamic shim insert;

applying a first dynamic current component to the dynamic shim insert; and applying a second dynamic current component to the main shim coil set, the second dynamic current component having the opposite polarity of the first dynamic current component.

17. A method according to claim 16, wherein the second steady-state current component has the same polarity as the first steady-state current component.

18. A method according to claim 16, wherein the second steady-state current component has the opposite polarity of the first steady-state current component.

19. A method according to claim 16, wherein applying a first steady-state current component comprises energizing at least one shim coil of the main shim coil set.

20. A method according to claim 16, wherein applying a second steady-state current component comprises energizing at least one shim coil of the dynamic shim insert.

21. A method according to claim 16, wherein applying a first dynamic current component comprises energizing at least one shim coil of the dynamic shim insert.

22. A method according to claim 16, wherein applying a second dynamic current component comprises energizing at least one shim coil of the main shim coil set.

* * * * *